United States Patent
Connolly et al.

(10) Patent No.: US 10,678,714 B2
(45) Date of Patent: Jun. 9, 2020

(54) DUAL IN-LINE MEMORY MODULE WITH DEDICATED READ AND WRITE PORTS

(71) Applicant: International Business Machines Corporation, Armonk, NY (US)

(72) Inventors: Brian J. Connolly, Williston, VT (US); Adam J. McPadden, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 121 days.

(21) Appl. No.: 15/820,490

(22) Filed: Nov. 22, 2017

(65) Prior Publication Data

US 2019/0155759 A1    May 23, 2019

(51) Int. Cl.
| | |
|---|---|
| *G06F 12/10* | (2016.01) |
| *G06F 13/16* | (2006.01) |
| *G11C 11/00* | (2006.01) |
| *G11C 14/00* | (2006.01) |
| *G11C 7/10* | (2006.01) |
| *G11C 5/04* | (2006.01) |

(52) U.S. Cl.
CPC ...... *G06F 13/1642* (2013.01); *G06F 13/1673* (2013.01); *G06F 13/1684* (2013.01); *G11C 11/005* (2013.01); *G11C 5/04* (2013.01); *G11C 7/1075* (2013.01); *G11C 14/0009* (2013.01)

(58) Field of Classification Search
CPC .......................... G06F 13/1642; G06F 13/1684
USPC .......................................................... 711/105
See application file for complete search history.

(56) References Cited

U.S. PATENT DOCUMENTS

| 7,243,172 B2 | 7/2007 | Oner et al. |
| 2004/0151203 A1* | 8/2004 | Gulati .................. H04L 49/3072 370/465 |
| 2014/0025877 A1 | 1/2014 | Talagala et al. |

(Continued)

FOREIGN PATENT DOCUMENTS

| WO | 2010101835 A1 | 9/2010 |
| WO | 2014193574 A1 | 12/2014 |
| WO | 2015012858 A1 | 1/2015 |

OTHER PUBLICATIONS

Chatterjee, Niladrish, et al., "Leveraging heterogeneity in DRAM main memories to accelerate critical word access", Microarchitecture (MICRO), 2012 45th Annual IEEE/ACM International Symposium on. IEEE, 2012, 12 pages.

*Primary Examiner* — Jae U Yu
(74) *Attorney, Agent, or Firm* — Cantor Colburn LLP; Bryan Bortnick

(57) ABSTRACT

Embodiments include method, systems and computer program products for operating a dual in-line memory module with dedicated READ and WRITE ports. The computer-implemented method receiving, by a memory controller, one or more memory requests to access a one or more memory modules. The memory controller determines a memory request type for each of the one or more memory requests. The memory controller directs the one or more memory requests to a port of the memory controller dedicated to handle a memory request for an associated memory request type. The memory controller accesses at least a portion of the one or more memory modules via the dedicated port in which the one or more memory requests are directed.

20 Claims, 6 Drawing Sheets

(56) References Cited

U.S. PATENT DOCUMENTS

2014/0201431 A1\* 7/2014 Woo ............... G06F 3/0604
                                                711/103
2016/0132241 A1   5/2016 Perego et al.
2017/0003182 A1   1/2017 Schweizer et al.

\* cited by examiner

DUAL IN-LINE MEMORY MODULE WITH DEDICATED READ AND WRITE PORTS

BACKGROUND

The present invention relates in general to memory management, and more specifically, to utilizing dedicated READ and WRITE ports to READ and WRITE from/to memory.

Computer systems, processors, caches, I/O device and other devices in the computer architecture access data in memory using one or more memory controllers. The memory controllers manage the movement of data to and from memory, for example, a dynamic random access memory (DRAM).

The memory can be a generation of double data rate (DDR) memory, for example, DDR3, DDR4, DDR5, etc. A series of memory circuits that make up the DDR memory can be used to create a dual in-line memory module (DIMM).

SUMMARY

Embodiments of the invention are directed to a computer-implemented method for operating a dual in-line memory module with dedicated READ and WRITE ports. A non-limiting example of the computer-implemented method includes receiving, by a memory controller, one or more memory requests to access a one or more memory modules. The memory controller determines a memory request type for each of the one or more memory requests. The memory controller directs the one or more memory requests to a port of the memory controller dedicated to handle a memory request for an associated memory request type. The memory controller accesses at least a portion of the one or more memory modules via the dedicated port in which the one or more memory requests are directed.

Embodiments of the invention are directed to a computer program product that can include a storage medium readable by a processing circuit that can store instructions for execution by the processing circuit for performing a method for operating a dual in-line memory module with dedicated READ and WRITE ports. The method includes receiving, by a memory controller, one or more memory requests to access a one or more memory modules. The memory controller determines a memory request type for each of the one or more memory requests. The memory controller directs the one or more memory requests to a port of the memory controller dedicated to handle a memory request for an associated memory request type. The memory controller accesses at least a portion of the one or more memory modules via the dedicated port in which the one or more memory requests are directed.

Embodiments of the invention are directed to a system for operating a dual in-line memory module with dedicated READ and WRITE ports. The system can include a processor and memory controller coupled to one or more memory modules. The memory controller comprises a dedicated READ port and a dedicated WRITE port to the one or more memory modules. The memory controller receives one or more memory requests to access a one or more memory modules. The memory controller determines a memory request type for each of the one or more memory requests. The memory controller directs the one or more memory requests to the dedicated READ port or the dedicated WRITE port dedicated to handle a memory request for an associated memory request type. The memory controller accesses at least a portion of the one or more memory modules via the dedicated READ port or the dedicated WRITE port in which the one or more memory requests are directed.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings in which:

Figure 1:
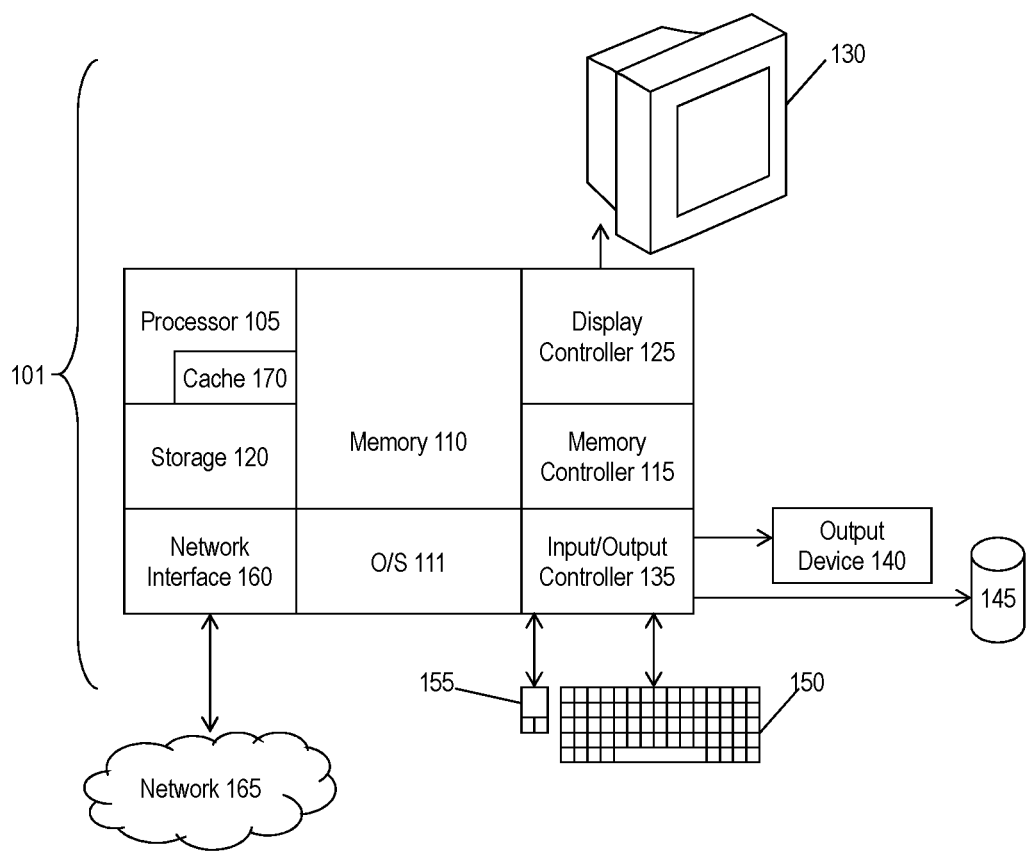
FIG. 1 is a block diagram illustrating one example of a processing system for practice of the teachings herein.

The diagrams depicted herein are illustrative. There can be many variations to the diagram or the operations described therein without departing from the spirit of the invention. For instance, the actions can be performed in a differing order or actions can be added, deleted or modified. In addition, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments of the present invention, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, embodiments of the invention are related in general to read and write operations between a memory controller and memory. A memory controller manages a variety of memory-related operations, including, for example, memory read operations (READ), memory write operations (WRITE). The memory controller interacts with one more memory modules, which can be dual in-line memory modules (DIMM) to perform the memory-related operations. The DIMM is typically comprised of random access memory (RAM, such as dynamic RAM (DRAM), static RAM (SRAM), synchronous dynamic RAM (SDRAM), etc.).

Current generations of DDR, for example, DDR4 and DDR5, have DIMM architectures that can support non-volatile memories (NVM), which can utilize the same DIMM sockets previously used to house RAM. Examples of these NVM DIMMs are NV DIMM-F (NVM with flash storage) and NVDIMM P (NVM with persistent DRAM).

The DDR4 DIMM supports a single memory channel from a single DIMM socket, while the DDR5 DIMM supports two memory channels from a single DIMM socket. DDR4 and DDR5 can share a common data bus whether the design is DDR4 or DDR5 (with two independent channels). The shared data bus is used for writing data to and reading data and from the DIMM.

In NVM technologies (ex., magneto-resistive random access memory (MRAM), resistive random-access memory (RRAM), phase-change memory (PCM), and FLASH) have noticeably longer write cycles than read cycles, unlike DRAM, where the write and read cycles are symmetrical in access times and bandwidth. Accordingly, the write times for NVMs often limit the bandwidth for reads between the memory and the memory controller due to the shared data bus, which hinders performance during memory operations. Additionally, the write times for NVM technologies are longer because some writes are non-deterministic.

Turning now to an overview of the aspects of the invention, one or more embodiments of the present invention provide two memory controllers working in concert as a single memory controller, each managing a read or write portion of a memory operation. Two DDR5 memory channels connecting a DDR DIMM to two memory controllers are can be converted to dedicated channels (a READ port and a WRITE port). Using an independent WRITE port allows for the slower write cycles to be performed without delaying the completion of READ accesses, which is the case when a shared memory channel is used. Accordingly, data bus performance is improved by maximizing the bandwidth for READs into a continuous data stream.

The above-described aspects of the invention address the shortcomings of the prior art's use of a shared data bus being used for READ and WRITE operations by leveraging the DDR5 DIMM's two memory channels to create dedicated WRITE and READ data memory channels. The dedicated channels are particularly useful when the DDR5 DIMMs contain NVMs because of the difference in time to complete READ and WRITE operations for NVMs.

FIG. 1 is a block diagram illustrating one example of a processing system 100 for the practice of the teachings described herein. In exemplary embodiments of the present invention, in terms of hardware architecture, the processing system 100 includes a computer 101 having a processor 105. The computer 101 further includes memory 110 coupled to a memory controller 115, and one or more input and/or output (I/O) devices 140, 145 (or peripherals) that are communicatively coupled via a local input/output controller 135. The input/output controller 135 can be, for example, but not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 105 is a hardware device for executing software, particularly that stored in storage 120, cache storage 170, or memory 110. The processor 105 can also execute software stored in registers that are located inside the processor 105 (not shown). Each register typically holds a word of data (often 32 or 64 bits). The processor 105 can be any custom made or commercially available processor, a central processing unit (CPU), an auxiliary processor among several processors associated with the computer 101, a semiconductor based microprocessor (in the form of a microchip or chip set), a macroprocessor, or generally any device for executing instructions. The processor 105 can include one or more cores.

The memory 110 can include any one or combination of volatile memory elements (e.g., random access memory (RAM, such as DRAM, SRAM, SDRAM, etc.)) and nonvolatile memory elements (NVM, such as (MRAM), (RRAM), (PCM), and FLASH). The memory 110 can reside in a dual in-line memory module (DIMM). The memory 110 can be arranged in a set of memory banks comprised of elements arranged in rows and columns. Moreover, the memory 110 may incorporate electronic, magnetic, optical, and/or other types of storage media. Note that the memory 110 can have a distributed architecture, where various components are situated remote from one another, but can be accessed by the processor 105.

The instructions in memory 110 may include one or more separate programs, each of which comprises an ordered listing of executable instructions for implementing logical functions. The instructions in the memory 110 can be a part of a suitable operating system (OS) 111. The operating system 111 essentially controls the execution of other computer programs and provides scheduling, input-output control, file and data management, memory management, and communication control and related services.

The cache 170 is a hardware device that stores data and is used by the processor 105 to reduce an average cost (time or energy) to access data from memory 110. The cache 170 is a smaller, faster memory that is located closer to one or more processor cores of the processor 105, which stores copies of the data from frequently used main memory locations. The amount of data accessed from memory 110 per request is based on a line size for cache 170.

The memory controller (MC) 115 is a hardware device for managing data traffic to and from memory 110. For example, the MC 115 can manage read and write operations to/from, for example, one or more NVM components associated with the memory 110.

In an exemplary embodiment of the present invention, a conventional keyboard 150 and mouse 155 can be coupled to the input/output controller 135. Other output devices such as the I/O devices 140, 145 may include input devices, for example, but not limited to a printer, a scanner, microphone, and the like. Finally, the I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 100 can further include a display controller 125 coupled to a display 130. In an exemplary embodiment of the present invention, the system 100 can further include a network interface 160 for coupling to a network 165. The network 165 can be an IP-based network for communication between the computer 101 and any external server, client and the like via a broadband connection. The network 165 transmits and receives data between the computer 101 and external systems. In an exemplary embodiment of the present invention, network 165 can be a managed IP network administered by a service provider. The network 165 may be implemented in a wireless fashion, e.g., using wireless protocols and technologies, such as WiFi, WiMax, etc. The network 165 can also be a packet-switched network such as a local area network, wide area network, metropolitan area network, Internet network, or another similar type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals. Other networks include body area networks (BAN) where the electric field of a human body can be used to transmit signals.

If the computer 101 is a PC, workstation, intelligent device or the like, the instructions in the memory 110 may further include a basic input output system (BIOS) (omitted for simplicity). The BIOS is a set of essential software routines that initialize and test hardware at startup, start the OS 111, and support the transfer of data among the hardware devices. The BIOS is stored in ROM so that the BIOS can be executed when the computer 101 is activated.

Figure 2:
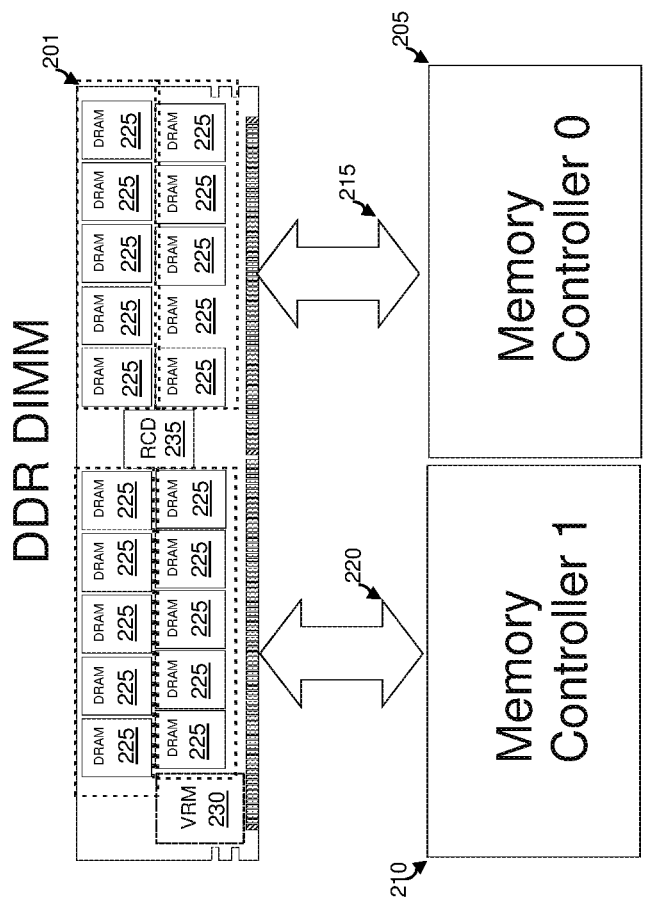
FIG. 2 is a diagram illustrating a traditional memory architecture.

In a typical memory architecture implementation 200, as shown in FIG. 2, DDR memory (ex., DDR5) is connected to memory controllers 205 and 210 using an associated bi-directional memory channel (215 and 220). The DDR memory can support two independent memory channels. The DDR memory is comprised of a plurality of volatile memory devices (ex., DRAM 225), which can reside in DIMM 201. The DIMM 201 also includes a voltage regulator module 230 and a register clock device 235. The DIMM 201 can support two physical ranks per channel.

The memory controllers 205 and 210 each use their associated memory channel, 215 and 220, respectively, to conduct both read and write operations to/from DDR memory. Using bi-directional channels is sufficient when using DRAM because READ and WRITE operations are completed within the same time frame; however, when using NVMs instead of DRAMs, a bottleneck occurs due to the difference in time to complete WRITE operations in comparison to READ operations. In addition, WRITE operations for NVMs can be non-deterministic, which can also affect the time to complete WRITE operations.

Figure 3:
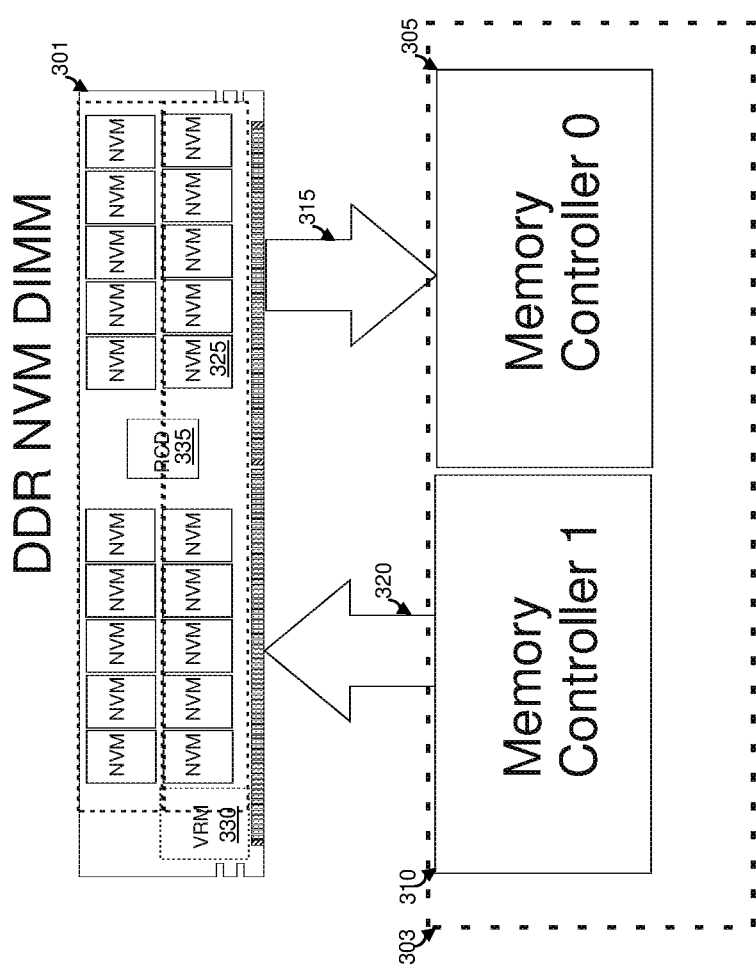
FIG. 3 is a diagram illustrating a memory architecture according to one or more embodiments of the present invention.

In accordance with a memory architecture 300 according to one or more embodiments of the present invention, as shown in FIG. 3, DDR memory (ex., DDR5) is connected to a memory controller 303, which is comprised of memory controllers 305 and 310, via dedicated memory channels 315 and 320, respectively. Memory channel 315 can be dedicated to handling READ operations from DDR memory and memory channel 320 can be dedicated to handling WRITE operations to DDR memory, which can potentially be slower to complete than READ operations when using NMVs. At least a portion of the DDR memory can be comprised of a plurality of NVMs 325, which can reside in DIMM 301. The DIMM 301 also includes a voltage regulator module 330 and a register clock device 335.

Accordingly, the configuration of FIG. 3 can convert the (2) DDR5 memory channels into a memory channel with a dedicated independent WRITE port and a memory channel with a dedicated independent READ port, which improves the data bus performance by maximizing the READ bandwidth into a continuous data stream. Using an independent WRITE port allows for the slower WRITE cycles to be performed without sharing the memory channel with READ accesses. The DIMM 301 can include 4 physical ranks that can be accessed independently. The memory controller 303 can maximize WRITES by using block WRITES to one of the 4 physical ranks, while the READ port is reading from the other 3 physical ranks. Using dedicated channels for READ and WRITE operations provides a variety of benefits in comparison to using bi-directional channels. Exemplary benefits of the implementation of FIG. 3 can at least be the following: a dedicated READ channel is simply limited by the memory device type and channel characteristics, using a dedicated WRITE channel eliminates the bandwidth bottleneck resultant from sharing the same data bus, X8 memory devices that support bifurcating into (2) 4 bit buses can be employed, READ bandwidth can be limited by a number of ranks associated with the NVMs, not by WRITE cycle accesses, continuous READ bursts (ex., a 16 bit burst) can occur between multiple memory ranks, simultaneous block WRITEs and READs bursts can occur without impeding the other bursts operation, the memory controller of FIG. 3 can be a simpler design than the typical design associated with FIG. 2, and bus wiring between the memory controller 303 and the DDR memory can be optimized for a particular operation (READ or WRITE).

Figure 4:
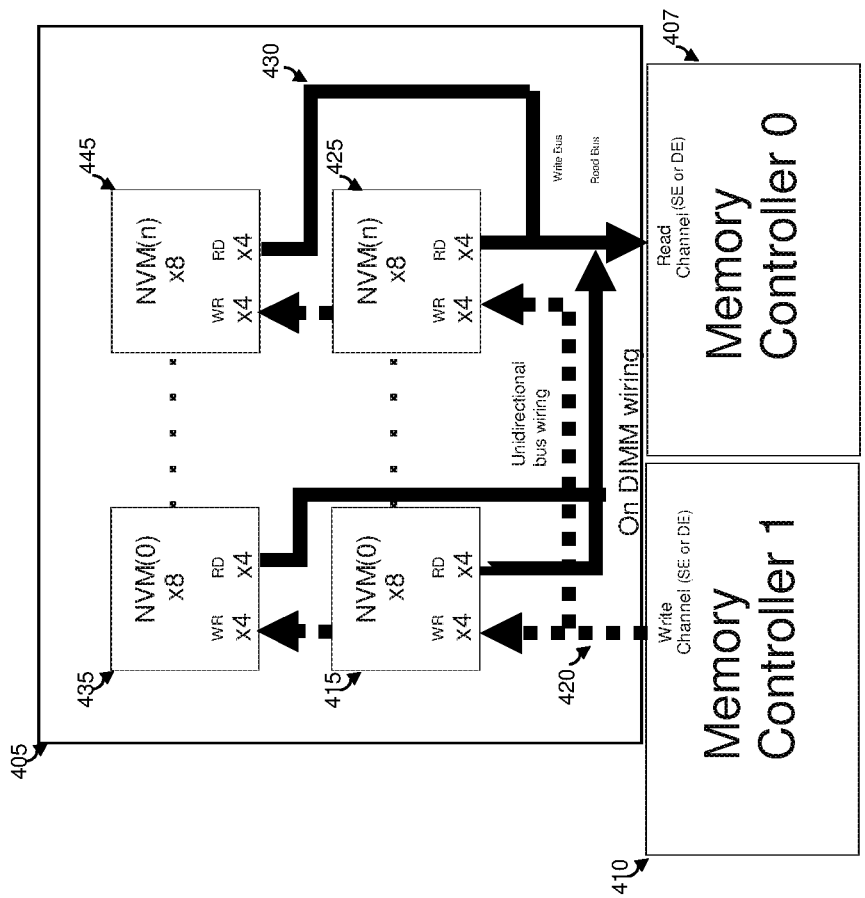
FIG. 4 is an illustration of an exemplary bus wiring for a memory architecture according to one or more embodiments of the present invention.

An exemplary embodiment of the one or more embodiments of the present invention, as shown in FIG. 4, illustrates a DIMM 405 which connects DDR memory and memory controllers 407 and 410 through dedicated memory channels. DIMM 405 includes on DIMM wiring, i.e., unidirectional data bus wiring 420 and 430 for 2 memory channels (WRITE, READ). NVMs 415, 425, 435 and 445 can each be a 2-Port Memory device that can support two different bus speeds. The port associated with a slower bus speed can be designated as a WRITE channel. The port associated with a faster bus speed can be designated as a READ channel. Memory controller 407, which handles READS and memory controller 410 which handles WRITES coordinate to manage a write and read cycle to ensure that READS and WRITES are not directed to the same NVM at the same time. In addition, using a WRITE port for WRITE accesses to NVM devices is particularly useful when WRITES are performed in blocks, which can delay a READ operation.

Figure 5:
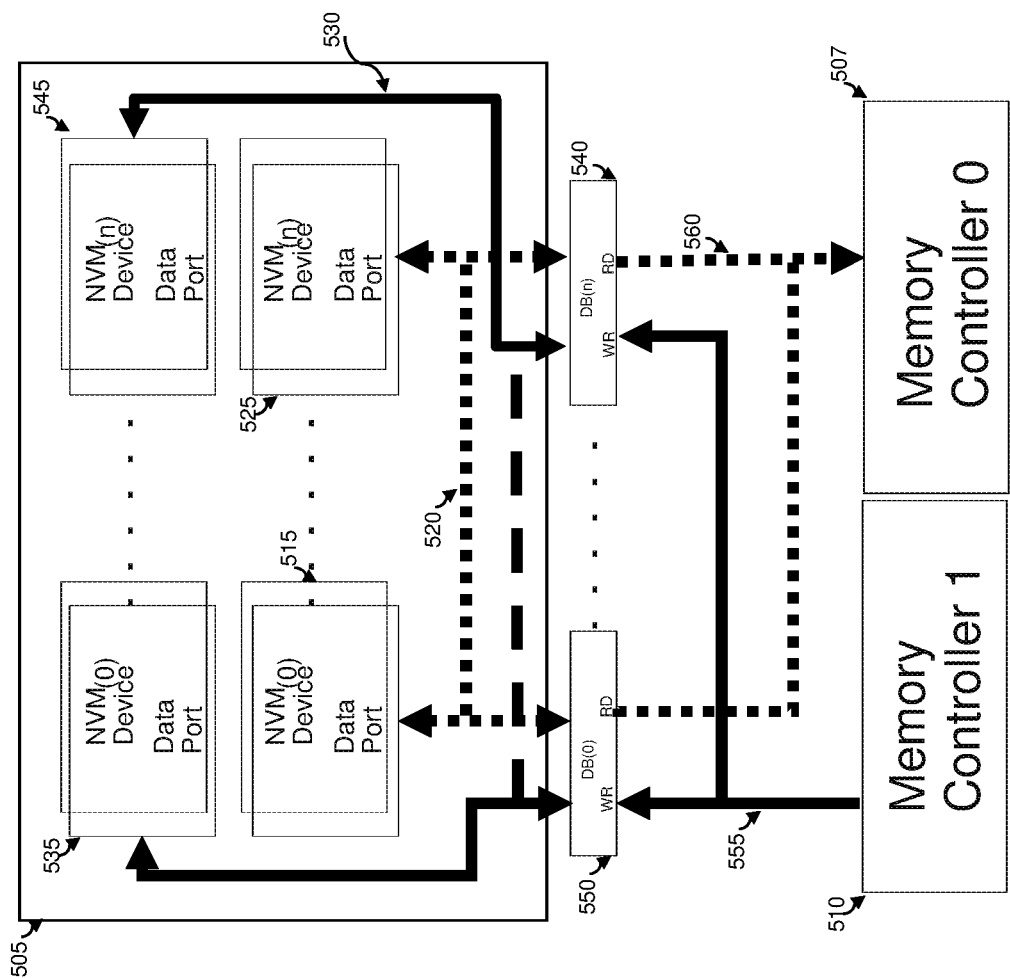
FIG. 5 is an illustration of an exemplary bus wiring for a memory architecture according to one or more embodiments of the present invention.

An exemplary embodiment of the one or more embodiments of the present invention, as shown in FIG. 5, illustrates a DIMM 505 which connects DDR memory and memory controllers 507 and 510 through dedicated memory channels. DIMM 505 includes on DIMM wiring, i.e., unidirectional data bus wiring 520 and 530 for 2 memory channels (WRITE, READ). NVMs 515, 525, 535 and 545 can each be single port memory devices. Data buffers 540 and 550 can be connected to the NVMs 515, 525, 535 and 545 via bi-directional data bus wiring 520 and 530. Data buffers 540 and 550 can allow separate WRITE and READ transactions to occur on different ranks of memory. For example, NVMs 515 and 525 can be associated with rank (1) and NVMs 535 and 545 can be associated with rank (0). The memory controllers 507 and 510 can control the direction of the bidirectional bus via a command address and control signals to the RCD 335 and data buffers 540 and 550.

The data buffers 540 and 550 can each include 2 unidirectional ports (WRITE, READ), which interface unidirectional WRITE and READ channels connected to memory controllers 507 and 510 via unidirectional data bus wiring 555 and 560. The 2 unidirectional port can support different speeds. The port associated with a slower bus speed can be designated as a WRITE channel. The port associated with a faster bus speed can be designated as a READ channel. Accordingly, READ and WRITE transactions can occur without impacting READ transaction bandwidth performance.

Figure 6:
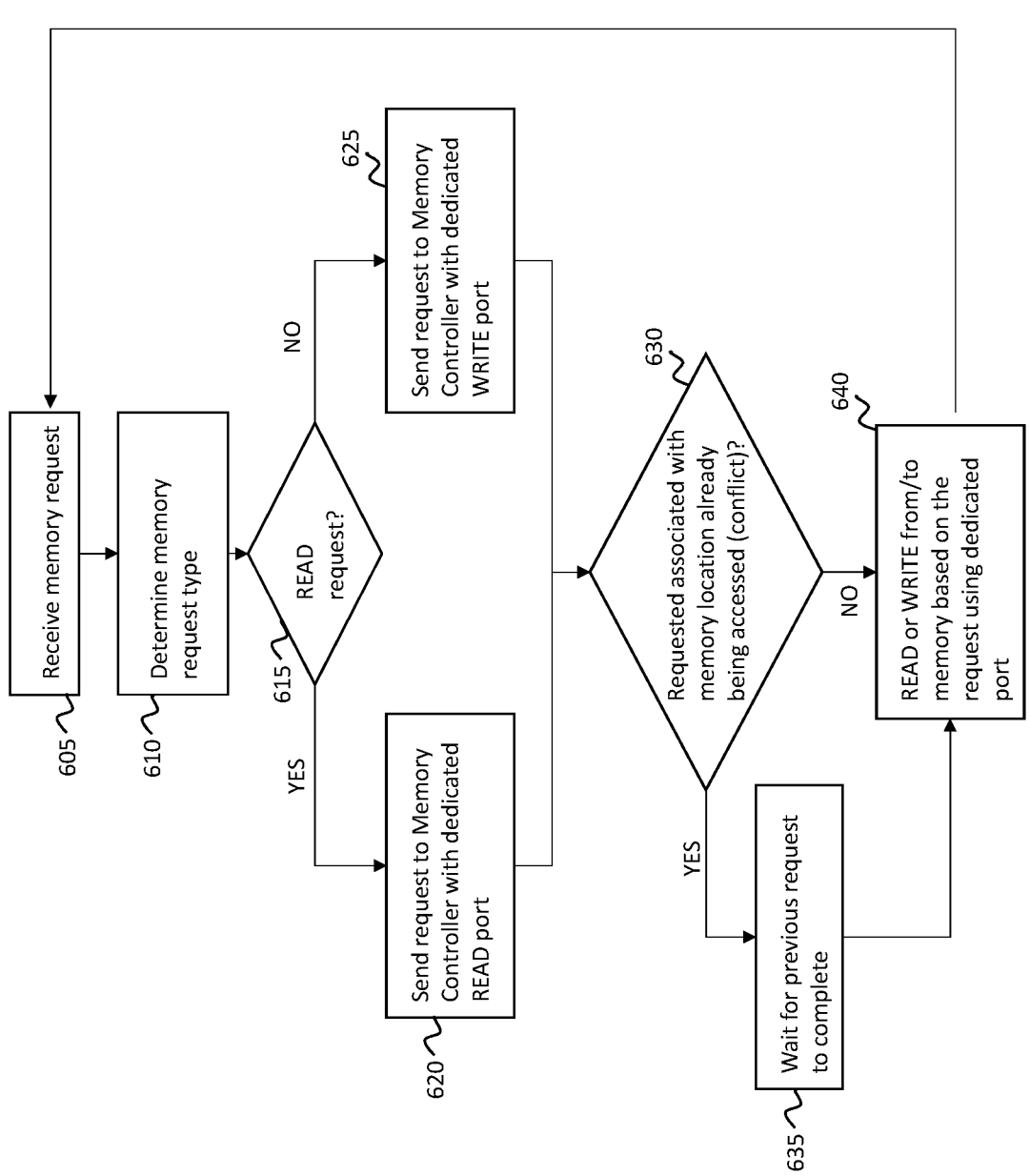
FIG. 6 is a flow diagram illustrating a method of operating a dual in-line memory module with dedicated READ and WRITE ports according to one or more embodiments of the present invention.

FIG. 6 is a flow diagram illustrating a method 600 of operating a dual in-line memory module with dedicated READ and WRITE ports according to one or more embodiments of the present invention. At block 605, a memory controller, for example, memory controller 303, receives a request to access memory. At block 610 the memory controller 303 can determine a request type (READ, WRITE) associated with the request to access memory. At block 615, the memory controller 303 can use the request type to direct the memory request. For example, the memory controller 303 can determine whether the request type associated with the request to access memory is a READ. If the request type is a READ, the method 600 proceeds to block 620 where the memory controller 303 can direct the READ request to a memory controller (ex., memory controller 305) having a dedicated READ port used to process READ requests. The method 600 then proceeds to block 630. If the request type is not a READ, but instead a WRITE, the method 600 proceeds to block 625 where the memory controller 303 can direct the WRITE request to a memory controller (ex., memory controller 310) having a dedicated WRITE port used to process WRITE requests. The method 600 then proceeds to block 630.

At block 630, the memory controller 303 can determine whether the request to access memory will conflict with a previous request to access memory. For example, a READ and WRITE can be directed to the same memory location. If the memory controller 303 determines that a conflict exists, at block 635, the memory controller 303 can wait for the previous request to access memory to complete. The method 600 would then proceed to block 640.

If the memory controller 303 determines that a conflict does not exist, method 600 proceeds to block 640. At block 640, the memory controller 303 accesses memory (ex, NVM 325) in accordance with the received request to access memory (WRITE, READ) using the memory controller's dedicated READ port for READS from memory and the memory controller's dedicated WRITE port for WRITES to memory.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the present invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method comprising:
    receiving, by a memory controller, memory request to access a dual in-line memory module (DIMM), wherein the DIMM comprises independent first and second bi-directional memory channels and at least one non-volatile memory chip;
    determining, by the memory controller, a memory request type for the memory request, the memory request type a READ request or a WRITE request;
    based on determining that the memory request type is a READ request, directing, by the memory controller, the memory request to a first port of the memory controller, and communicating the memory request to the DIMM via the first memory channel; and
    based on determining that the memory request type is a WRITE request, directing, by the memory controller, the memory request to a second port of the memory controller and communicating the memory request to the DIMM via the second memory channel,
    thereby utilizing the first memory channel on the DIMM as a dedicated READ channel and the second memory channel on the DIMM as a dedicated WRITE channel.

2. The computer-implemented method of claim 1, wherein the first port of the memory controller comprises a dedicated READ port and the second port of the memory controller comprises a dedicated WRITE port.

3. The computer-implemented method of claim 2, wherein the dedicated READ port has a bandwidth that can accommodate a continuous data stream of READ requests to the DIMM.

4. The computer-implemented method of claim 1, wherein the DIMM comprises double data rate 5 memory.

5. The computer-implemented method of claim 1, wherein bus wiring connecting the memory controller and the DIMM comprises a READ bus and a WRITE bus.

6. The computer-implemented method of claim 1, wherein the memory controller supports block WRITES and burst READS to different ranks of the DIMM.

7. The computer implemented method of claim 1, wherein the memory controller comprises a first memory controller having the first port of the memory controller and a second memory controller having the second port of the memory controller, the first memory controller and the second memory controller operating in concert as the memory controller.

8. A computer program product comprising:
a non-transitory computer readable storage medium having stored thereon first program instructions executable by a processor to cause the processor to:
receive a memory request to access a dual in-line memory module (DIMM), wherein the DIMM comprises independent first and second bi-directional memory channels and at least one non-volatile memory chip;
determine a memory request type for the memory request, the memory request type a READ request or a WRITE request;
based on determining that the memory request is a READ request, directing the memory request to a first port of a memory controller, and communicating the memory request to the DIMM via the first memory channel; and
based on determining that the memory request type is a WRITE request, directing, by the memory controller, the memory request to a second port of the memory controller and communicating the memory request to the DIMM via the second memory channel,
thereby utilizing the first memory channel on the DIMM as a dedicated READ channel and the second memory channel on the DIMM as a dedicated WRITE channel.

9. The computer program product of claim 8, wherein the first port of the memory controller comprises a dedicated READ port and the second port of the memory controller comprises a dedicated WRITE port.

10. The computer program product of claim 9, wherein the dedicated READ port has a bandwidth that can accommodate a continuous data stream of READ requests to the DIMM.

11. The computer program product of claim 8, wherein the DIMM comprises double data rate 5 memory.

12. The computer program product of claim 8, wherein the memory controller comprises a first memory controller having the first port of the memory controller and a second memory controller having the second port of the memory controller, the first memory controller and the second memory controller operating in concert as the memory controller.

13. A system comprising:
a processor;
a storage medium comprising a dual in-line memory module (DIMM), the storage medium being coupled to the processor;
a memory controller comprising a first port that is a dedicated READ port and a second port that is a dedicated WRITE port both coupled to the DIMM, wherein the DIMM comprises independent first and second bi-directional memory channels and at least one non-volatile memory chip, the memory controller operable to:
receive a memory request to access the DIMM;
determine a memory request type for the memory request, the memory request type a READ request or a WRITE request;
based on determining that the memory request type is a READ request, directing the memory request to the first port of the memory controller, and communicating the memory request to the DIMM via the first memory channel or; and
based on determining that the memory request type is a WRITE request, directing the memory request to the second port of the memory controller, and communicating the memory request to the DIMM via the second memory channel,
thereby utilizing the first memory channel on the DIMM as a dedicated READ channel and the second memory channel on the DIMM as a dedicated WRITE channel.

14. The system of claim 13, wherein the dedicated READ port has a bandwidth that can accommodate a continuous data stream of READ requests to the DIMM.

15. The system of claim 13, further comprising one or more data buffers connecting the memory controller and DIMM.

16. The system of claim 15, further comprising bi-directional bus wiring connecting the one or more data buffers to the DIMM.

17. The system of claim 15, further comprising unidirectional bus wiring connecting the one or more data buffers to the memory controller.

18. The system of claim 13, wherein the memory controller supports block WRITES and burst READS to different ranks of the DIMM.

19. The system of claim 13, wherein the DIMM comprises double data rate 5 memory.

20. The system of claim 13, wherein the memory controller comprises a first memory controller having the first port of the memory controller and a second memory controller having the second port of the memory controller, the first memory controller and the second memory controller operating in concert as the memory controller.

* * * * *